(12) United States Patent
Kimura et al.

(10) Patent No.: US 8,347,168 B2
(45) Date of Patent: Jan. 1, 2013

(54) MULTIPLE-INPUT-MULTIPLE-OUTPUT TRANSMISSION USING NON-BINARY LDPC CODING

(75) Inventors: Dai Kimura, Kawasaki (JP); Frederic Guilloud, Brest (FR); Ramesh Mahendra Pyndiah, Brest (FR)

(73) Assignees: Fujitsu Limited, Kawasaki (JP); Institut Telecom/ TELECOM Bretagne, Brest Cedex (FR)

( * ) Notice: Subject to any disclaimer, the term of this patent is extended or adjusted under 35 U.S.C. 154(b) by 747 days.

(21) Appl. No.: 12/441,843

(22) PCT Filed: Sep. 18, 2006

(86) PCT No.: PCT/IB2006/003620
§ 371 (c)(1),
(2), (4) Date: Oct. 16, 2009

(87) PCT Pub. No.: WO2008/035133
PCT Pub. Date: Mar. 27, 2008

(65) Prior Publication Data
US 2010/0107031 A1 Apr. 29, 2010

(51) Int. Cl.
*G06F 11/00* (2006.01)
(52) U.S. Cl. .................................................. 714/752
(58) Field of Classification Search .................... 714/752
See application file for complete search history.

(56) References Cited

U.S. PATENT DOCUMENTS

| | | | | |
|---|---|---|---|---|
| 5,636,253 | A * | 6/1997 | Spruyt | 375/348 |
| 2005/0268202 | A1* | 12/2005 | Molisch et al. | 714/752 |
| 2006/0158447 | A1* | 7/2006 | McGraw et al. | 345/419 |
| 2007/0168843 | A1* | 7/2007 | Kanaoka et al. | 714/792 |
| 2010/0177845 | A1* | 7/2010 | Murakami et al. | 375/295 |
| 2011/0142181 | A1* | 6/2011 | Leshem et al. | 375/341 |

OTHER PUBLICATIONS

Byers G J et al, "Non-binary and concatenated LDPC codes for multiple-antenna systems" Africon, 2004. 7th Africon Conference in Africa Gaborone, Botswana Sep. 15-17, 2004, Piscataway, NJ, USA, IEEE, vol. 1, Sep. 15, 2004, pp. 83-88, XP010780470 ISBN: 0-7803-8605-1 p. 84, left-hand column, paragraph II; p. 84, right-hand column, paragraph III; p. 84, right-hand column, paragraph IV—p. 85, left-hand column.

(Continued)

*Primary Examiner* — Scott Baderman
*Assistant Examiner* — Yair Leibovich
(74) *Attorney, Agent, or Firm* — Murphy & King, P.C.

(57) ABSTRACT

A wireless communication system constructed by a MIMO antenna system and transmitting information from a transmitter having Nt number of transmitting antennas to a receiver 3 having Nr number of receiving antennas. The receiver 3 of this wireless communication system 1 linking the inputs and outputs between a demodulating unit 32 demodulating the input signals from receiving antennas 31 and a decoding unit 35 receiving as input that demodulation output and decoding the non-binary LDPC code of the GF(q) one-to-one under predetermined conditions to enable the inputs and outputs of this demodulating unit 32 and decoding unit 35 to be directly connected and thereby improve the decoding characteristic. That predetermined condition is preferably $q=2^{Nt \cdot m}$.

8 Claims, 8 Drawing Sheets

OTHER PUBLICATIONS

Goupil A et al: "Multiple access receiver based on hierarchical clusters/users detection using non-binary LDPC codes"Communications, Computer and Signal Processing, PACRIM. 2005 IEEE Pacific Rim Conference on Victoria, BC, Canada Aug. 24-26, 2005, Piscataway, NJ, USA, IEEE, Aug. 24, 2005, pp. 304-307, XP010841464 ISBN: 0-7803-9195-0; p. 305, left-hand column, paragraph II.C p. 305, right-hand column, paragraph III.A—left-hand column.

International Search Report dated Feb. 5, 2007.

Feno Guo et al., "Low complexity non-binary LDPC and modulation schemes communicating over MIMO channels" Vehicular Technology Conference, VTC2004-FALL. 2004 IEEE 60th Los Angeles, CA, USA Sep. 26-29, 2004, Piscataway, NJ, USA, IEEE, Sep. 26, 2004, pp. 1294-1298, XP010786833 ISBN: 0-7803-8521-7.

* cited by examiner

[TANNER GRAPH]

PARITY CHECK MATRIX H

MULTIPLE-INPUT-MULTIPLE-OUTPUT TRANSMISSION USING NON-BINARY LDPC CODING

TECHNICAL FIELD

The present invention relates to a wireless communication system, in particular a wireless communication system employing a multi-input multi-output (MIMO) antenna system, further relates to a method of constructing that wireless communication system and a receiver forming the receiving side of that wireless communication system.

BACKGROUND ART

In recent years, the MIMO antenna system has come under attention as a transmission technology for wireless communications. This MIMO antenna system provides a plurality of transmitting/receiving antennas at a transmitting side of a wireless communication system and provides a plurality of transmitting/receiving antennas at that receiving side and has these multi-antennas transmit and receive information. In this MIMO antenna system, a large number of communication paths are formed between all antennas of the transmitting side and all antennas of the receiving side. As a result, the speed of data transmitted from the transmitting side to the receiving side is multiplied. For example, if using two transmitting antennas, the speed of that transmitted data is doubled, while if using four, it is quadrupled. Therefore, the channel capacity between the transmitter and receiver can be greatly increased. However, in this case, it is assumed that the bit correlation between the plurality of transmitting antennas is sufficiently small and the bit correlation between the plurality of receiving antennas is sufficiently small.

On the other hand, further, in recent years, a LDPC (Low Density Parity Check) code has begun to be used for encoding the transmitted data in a wireless communication system etc. This LDPC code, like the conventional turbo code, is an error correction code having superior characteristics close to the Shannon limit.

In particular, it is known that this LDPC code has a decoding characteristic equal to the turbo code or, when that code length is long, exhibits better characteristics than the turbo code. For example, when the code length is tens of thousands of bits or more, sometimes it exceeds the decoding characteristic of the turbo code currently employed in third generation mobile phone systems.

As the LDPC code, currently a binary type LDPC code and a non-binary type LDPC code are known, but if the latter non-binary LDPC code is used, there is the defect that the amount of processing increases compared with the former binary LDPC code. However, while there is such a defect, if this non-binary LDPC code is used, even if the code length becomes short, an improvement of the decoding characteristic can be expected compared with use of the binary LDPC code.

Therefore, it can be easily understood that by using both the MIMO antenna system and non-binary LDPC coding system, a wireless communication system can be realized which increases the channel capacity between the transmitter and receiver and further simultaneously improves the decoding characteristic.

When realizing a high efficiency wireless communication system using this MIMO antenna system and non-binary LDPC coding system, first, it is proposed, based on the general technique of constructing current wireless communication systems using the general binary LDPC coding system for that MIMO antenna system, to construct a high efficiency wireless communication system using the intended non-binary LDPC coding system of the present invention together with that MIMO antenna system.

That is, a new technique utilizing the normal technique of using both a MIMO antenna system and general binary LDPC coding system realizes the high efficiency wireless communication system using both a MIMO antenna system and non-binary LDPC coding system.

However, if trying to use the normal technique as it is to realize the high efficiency wireless communication system using both the non-binary LDPC coding system and MIMO antenna system, due to the later explained reasons, the problem arises of both the information regarding the bit correlation between the plurality of transmitting antennas in the MIMO antenna system and information regarding the inter-bit correlation in the modulated symbols being lost (loss of correlation information) and of the decoding characteristic of the non-binary LDPC code at the receiving side ending up deteriorating.

This being so, as already explained, the advantage of improvement of the decoding characteristic expected when using a non-binary LDPC code ends up being cancelled out by the disadvantage of the deterioration of the decoding characteristic due to the loss of correlation information. As a result, the advantage of using the non-binary LDPC code is lost and therefore realization of an effective high efficiency wireless communication system becomes difficult.

Note that as known in prior art relating to the present invention, there are the following [Non-Patent Document 1] and [Non-Patent Document 2].

[Non-Patent Document 1] M. C. Davey and D. MacKay, "Low-Density Parity Check Codes over GF (q)", IEEE Comm. Lett., Vol. 2, No. 6, June 1998.

[Non-Patent Document 2] F. Guo and L. Hanzo, "Low complexity non-binary LDPC and modulation schemes over MIMO channels", Vehicular Technology Conference, 2004, VTC2004-Fall, vol. 2, pp. 1294-1298, September 2004.

DISCLOSURE OF THE INVENTION

Problem to be Solved by the Invention

Therefore, the present invention, in view of the problems, has as its object to provide a dual "MIMO+non-binary LDPC" type wireless communication system enabling transmission and reception of data without deterioration of the decoding characteristic of the non-binary LDPC code at the receiving side.

Further, it has as its object the provision of a method of constructing that wireless communication system and a receiver forming the receiving side of a wireless communication system.

MODE OF WORKING THE INVENTION

Figure 1:
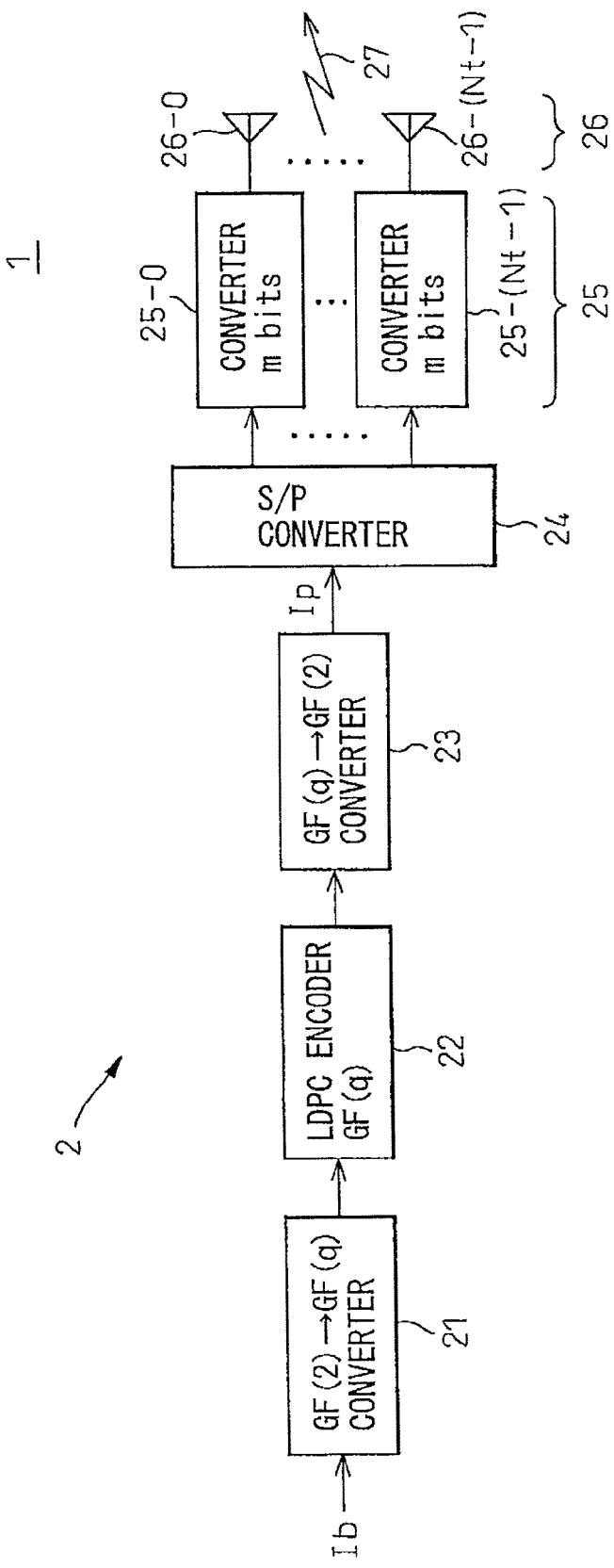
FIG. 1 is a view of an example of a transmitter forming a transmitting side of a wireless communication system according to the present invention.

FIG. 1 is a view of an example of a transmitter forming a transmitting side of a wireless communication system according to the present invention. In the figure, reference number 1 indicates a wireless communication system as a whole, while 2 indicates a transmitter forming the transmitting side of the system 1. Note that a receiver 3 forming the receiving side of the system 1 is shown in the later explained FIG. 2, but the transmitter 2 also has the function of the receiver of FIG. 2, and the receiver 3 also has the function of the transmitter of FIG. 1. For example, one side of the system 1 forms a base station, while the other side forms a mobile station in this configuration.

In FIG. 1, the transmitter 2 has an LDPC encoder 22 receiving as input information bits Ib to be encoded and encoding them by a non-binary LDPC code and a modulation unit 25 modulating the encoded information bits Ip produced at this LDPC encoder 22 and transmitting them to the receiver 2 side through a wireless channel 27.

Here, that non-binary LDPC code will be explained.

The LDPC code having the coding rate R and the code length N is defined as a linear block code by a parity check matrix H of M rows and N columns. This LDPC code is called a "non-binary LDPC code" when that parity check matrix H is comprised of non-binary Galois Field elements.

Here, if expressing a Galois Field having q number of elements as GF(q), in the case of a non-binary LDPC code, q>2. In particular, a case where q is a power of 2 is generally used. For differentiation, an LDPC code when q=2 is called a "binary LDPC code". An LDPC code is defined as Hc=0 using the parity check matrix H. The computation is performed on the GF(q). Here, the c is a code word vector of N rows and 1 column. That is, the vectors c satisfying the above equation Hc=0 for a certain parity check matrix H are defined as code words of the LDPC code. The parity check matrix H of this LDPC code is characterized by a small density of non-zero components.

On the other hand, an LDPC code is decoded on a Tanner graph corresponding to the parity check matrix H (see the later explained FIG. 4). This Tanner graph is comprised of N number of variable nodes and M number of check nodes (see N and M of FIG. 5) and WcN=WrM number of edges. These correspond to the columns and rows in the parity check matrix H and non-zero components. Here, We expresses column weighting (number of non-zero components present in column), while Wr expresses row weighting (number of non-zero components present in row). Note that here, for simplification, the case where the column weight and row weight are constant (regular LDPC code) is considered.

For the decoding, a BP (Belief Propagation) algorithm on the Tanner graph is used. This is a type of repetitive decoding and switches information (messages) between variable nodes and check nodes to make the likelihoods of the bits converge to the sub-optimal value. The receiving characteristic of the LDPC code greatly depends on this Tanner graph, that is, the parity check matrix H.

Returning again to FIG. 1, the transmitter 2 is provided with an input side converter 21 provided at the input side of the above-mentioned LDPC encoder 22 for converting the binary information bits Ib to the non-binary multi-value symbols and an output side converter 23 provided at the output side of the LDPC encoder 22 for converting the encoded symbols of the non-binary multi-value symbols encoded by this LDPC encoder 22 to binary bits.

The input side converter 21 performs the multi-value conversion of, taking the example of the case of GF(4),

00→0
01→1
10→2
11→3

(GF(2)→GF(4)) for matching the binary information bits Ib to the multi-value being operated by non-binary LDPC encoder 22, while the output side converter 23 similarly performs the binary conversion of, taking as an example the case of GF(4),

0→00
1→01
2→10
3→11

(GF(4)→GF(2)), for binary operation of the multi-value output from the LDPC encoder 22.

The information bits from the non-binary LDPC encoder 22 accompanying the operations of the input side converter (GF(2)→GF(q)) 21 and output side converter (GF(q)→GF(2)) 23, as already explained, are modulated by the modulation unit 25, then transmitted over the wireless channel 27. In this case, the wireless communication system 1 according to the present invention applies the MIMO antenna system to the above-mentioned non-binary LDPC coding system and further has a MIMO configuration compatible with this MIMO antenna system.

That is, for this MIMO configuration, first the information bits from the non-binary encoders (21,22,23) are converted from a serial to parallel (S/P) format. This is performed by the serial/parallel (S/P) converter 24. The plurality (Nt) of parallel modulated symbols output from this are transmitted over the wireless channel 27 from the corresponding antennas of the Nt number of individual transmitting antennas 26-0 to 26-(Nt−1) at the transmitting multi-antenna part 26.

Therefore, the above-mentioned modulation unit 25 is further comprised of a plurality (Nt) of individual modulation units 25-0 to 25-(Nt−1) corresponding to the individual transmitting antennas 26-0 to 26-(Nt−1). Here, the individual modulation units (25-0 to 25-(Nt−1)) receive as input and modulate the parallel bits comprised of groups of m bits. Here, m is the number of bits per modulated symbol, that is, the order of modulation. For example, if the transmitter 2 employs 16 QAM (Quadrature Amplitude Modulation) as the modulation scheme, m=4, while if 64 QAM, m=6. Further, if employing QPSK (Quadrature Phase Shift Keying), m=2. This order of modulation m, as explained later, becomes an important parameter together with the number Nt of the individual transmitting antennas (26-0 to 26-(Nt−1)) in constructing the wireless communication system 1 according to the present invention.

In the above, the transmitter 2 was explained. Next, the receiver 3 of FIG. 2 according to the present invention will be explained. Before that, first, referring to FIG. 3, in general, that is, not a MIMO type, but an SISO (Single Input Single Output) type receiver, employing a general non-binary reception processor will be explained as the receiver 4.

Figure 3:
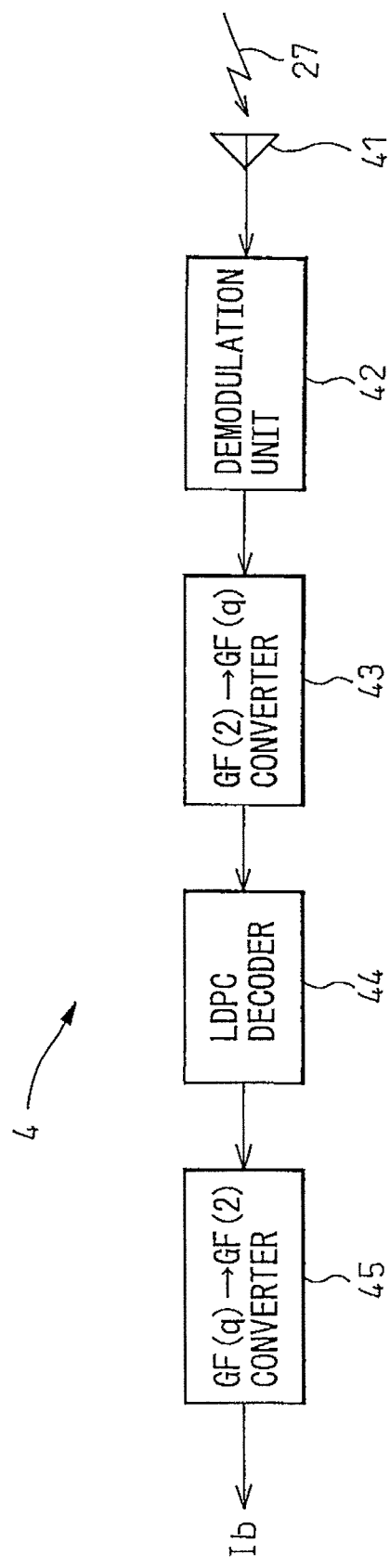
FIG. 3 is a view of the configuration of an SISO type general receiver in a wireless communication system using a non-binary decoding system.

In this FIG. 3, the receiver 4 is a receiver including a demodulating unit 42 receiving a transmission signal encoded by a non-binary LDPC code (22), modulated (25), and transmitted by the transmitting side (2) and demodulating it and an LDPC decoder 44 decoding the demodulated bits expressed by the bit likelihood from this demodulating unit 42 by a non-binary LDPC code.

This receiver 4 further is provided with an input side converter 43 provided at the input side of the non-binary LDPC decoder 44 for converting the binary demodulated bits expressed by the bit likelihood from the demodulating unit 42 to non-binary multi-value symbols and an output side converter 45 provided at the output side of the LDPC decoder 44 for converting the information bits comprised of the non-binary multi-value symbols decoded by that LDPC decoder 44 to binary information bits Ib.

That is, this output side converter 45 performs the binary conversion of

0→00
1→01
2→10
3→11

(GF(4)→GF(2)).

On the other hand, the input side converter 43 is suitably called a "bit likelihood converter" judging from that function. This converter groups together the binary (bit) likelihoods obtained by the demodulating unit 42 for each p ($=\log_2(q)$) bits and converts them to one symbol of non-binary likelihood. As an example, the GF(2)→GF(4) conversion becomes:

$Q_0 = P_{10}P_{20}$
$Q_1 = P_{10}P_{21}$
$Q_2 = P_{11}P_{20}$
$Q_3 = P_{11}P_{21}$

Here, $P_{10}$ is the probability of the 2nd bit in the two bits to be converted to a GF(4) symbol being 0, while $Q_0$ is the probability of the GF(4) symbol being 0.

The thus obtained symbol likelihood is input to the LDPC decoder 44. This decoder 44 decodes the LDPC code by the already explained Tanner graph (FIG. 4).

Figures 4, 5:
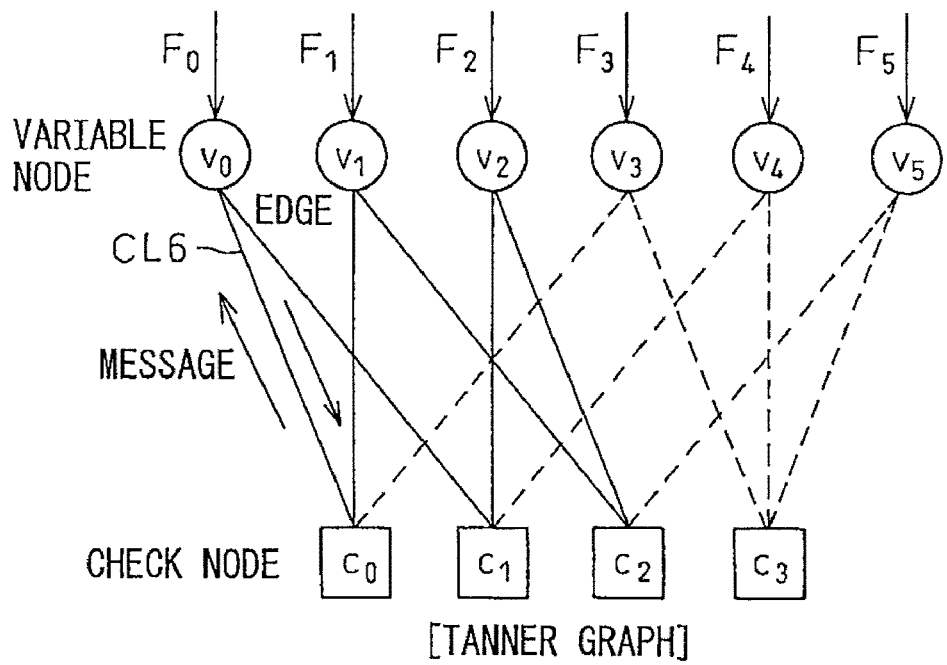
FIG. 4 is a view of a known Tanner graph applied to the parity check matrix H of FIG. 5.
FIG. 5 is a view of a parity check matrix H as an example.

FIG. 4 is a view showing a Tanner graph corresponding to the parity check matrix H of FIG. 5, FIG. 5 is a view of a parity check matrix H given as an example.

In FIG. 4, $V_0, V_1, \ldots V_5$ are so-called variable nodes, while $C_0, C_1 \ldots C_3$ are so-called check nodes. The $F_0, F_1 \ldots F_5$ input to the variable nodes (V) are the results of demodulation from the demodulating unit 42 of FIG. 3 through the above-mentioned bit likelihood converter (43). Note that the bold line CL6 in FIG. 4 corresponds to the cycle CL shown in FIG. 5. This length is, in the illustrated example, 6.

Here, returning to FIG. 2, this FIG. 2 is a view of a first embodiment of the receiver 3 forming the receiving side of the wireless communication system 1 according to the present invention. Note that in this wireless communication system 1, the plurality (Nt) of individual transmitting antennas 26-0 to 26-(Nt−1) shown in FIG. 1 simultaneously transmit different signals in the same frequency band.

Figure 2:
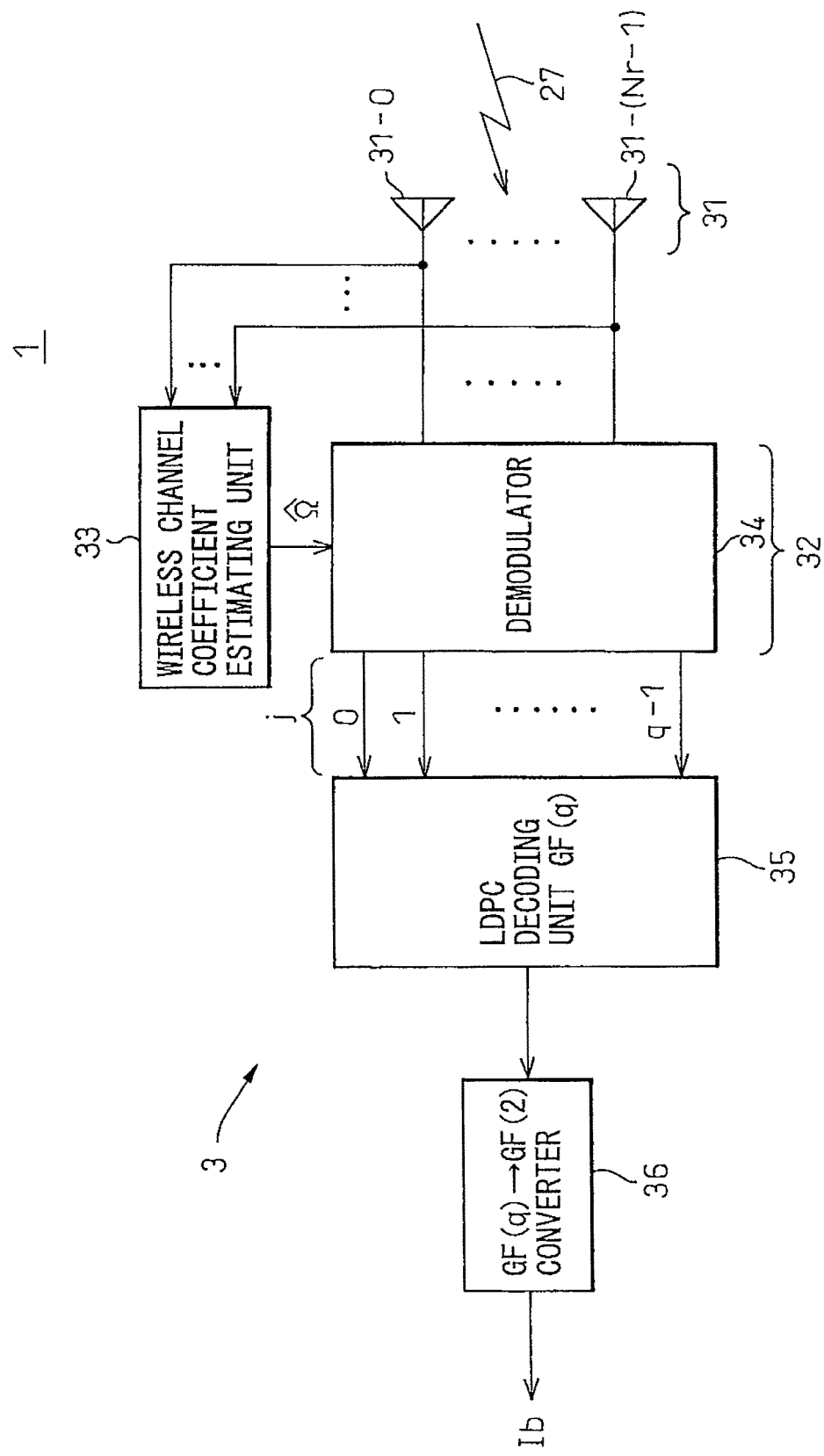
FIG. 2 is a view of a first embodiment of a receiver forming a receiving side of a wireless communication system according to the present invention.

On the other hand, the receiver 3 of FIG. 2 employs a MIMO antenna system receiving the composite transmission signal transmitted in the same band in the same time through the wireless channel 27 by the receiving multi-antenna part 31 comprised of the plurality (Nr) of separate receiving antennas 31-0 to 31-(Nr−1) and performing predetermined signal reception processing to separate the combined transmission signal. Note that the number of transmitting antennas (26) and the number of receiving antennas (31) do not necessarily have to be the same, so these are expressed by the above Nt and Nr.

As shown in FIG. 2, the receiver 3 according to the present invention receives the combined transmission signal as an input signal at the receiving multi-antenna part 31, the demodulating unit 32 comprised of the channel coefficient estimating unit 33 and demodulator 34 demodulates this, and the non-binary LDPC decoding unit 35 decodes the demodulated bits. The decoded symbols of dimension (q) from this decoding unit (GF(q)) 35 are passed through the output side converter 36 (same as 45 of FIG. 3) converting it to binary bits of dimension (2) to be reproduced as the original information bits Ib.

Here, in FIG. 2, taking note of the demodulating unit 32 and its periphery characterizing the present invention, first, in the above-mentioned FIG. 1, the binary transmission bit series of length pK ($p=\log_2 q$) of dimension (2) is converted to a series of symbol of length K comprised of dimension (q) expressed by the number of elements q. Further, as already explained, that series of symbol is encoded by the non-binary LDPC encoder 22 of dimension (q), then a series of encoded symbols of length N is produced, then is converted by the converter 23 again to the dimension (2), then is modulated by the modulation unit (25-0 to 25-(Nt−1)) for each of the individual transmitting antennas (26-0 to 26-(Nt−1)) and transmitted to the receiver 3 side of FIG. 2.

The receiver 3 of FIG. 2 estimates the complex wireless channel coefficients between the individual antennas 31-0 to 31-(Nr−1) and the individual transmitting antennas 26-0 to 26-(Nt−1). This is performed by the channel coefficient estimating unit 33. Note that this channel coefficient estimation can be performed by using for example orthogonal known pilot signals between individual transmitting antennas.

Using this estimated channel coefficient matrix as Ω, the demodulator 34 uses the later explained predetermined relation (1) to calculate the input signal (demodulated bits) to the non-binary LDPC decoding unit 35. Based on this input signal, the decoding unit 35 performs non-binary decoding and further the dimension converting unit 36 converts the result to a binary system to finally obtain a binary received bit series (information bits Ib).

Here, the points of the receiver 3 shown in FIG. 2 will be summarized. First, the receiver 3 predicated on is a receiver provided with a plurality of receiving antennas 31 for transmitting and receiving information with a transmitter 2 provided with a plurality of transmitting antennas 26 under a multi-input multi-output (MIMO) antenna system and uses a non-binary LDPC code as the channel coding scheme for transmission/reception with that transmitter 2.

Here, this receiver 3 is a receiver at a receiving part including a demodulating unit 32 demodulating input signal information from a receiving antennas 31 and a decoding unit 35 decoding that input signal in accordance with the non-binary LDPC code at the output side of this demodulating unit 32, which receiver can make the output group of multi-value symbols expressed by the symbol likelihood from that demodulating unit 32 and the input group of the decoding unit 35 comprised of the non-binary LDPC code of the predetermined GF(q) match one-to-one to directly connect these demodulating unit 32 and decoding unit 35.

That is, if assuming that for example 256 types of symbol likelihood are output from the demodulator 34 of the demodulating unit 32 (at j of FIG. 2, the group of outputs is "0, 1 . . . 255"), the non-binary LDPC decoding unit 35 is made of a GF (256) LDPC decoding unit and that group of 256 types of input are linked completely one-to-one with the group of 256 types of outputs "0, 1 . . . 255".

Conversely, if the non-binary LDPC decoding unit 35 is comprised of GF (256), a wireless communication system 1 is configured where the demodulator 34 gives 256 types of output (symbol likelihoods).

In this way, the outputs of the demodulator 34 at the receiver 3 and the inputs of the decoding unit 35 are made to completely match one-to-one, so the later explained conventional marginalization can be eliminated. That is, in a wireless communication system 1 including this receiver 3, there is no longer the past problem of (i) the information on the bit correlation between the plurality of transmitting antennas and (ii) the information on the inter-bit correlation in the modulated symbols being lost before the decoding. Therefore, there is no longer the problem of the decoding characteristic of the non-binary LDPC code at the receiver 3 deteriorating.

Summarizing the points of the wireless communication system 1 according to the present invention in the same way as the above points of the receiver 3, first, the predicated wireless communication system is a wireless communication system comprised of a transmitter 2 provided with a plurality of transmitting antennas 26 and a receiver 3 provided with a plurality of receiving antennas 31 transmitting and receiving information under a multi-input multi-output (MIMO) antenna system and using a non-binary LDPC code as the channel coding scheme between these transmitter 2 and receiver 3. Here, the above receiver 3, which includes a demodulating unit 32 demodulating an input signal from a receiving antenna 26 and a decoding unit 35 at the output side of this demodulating unit 32 for decoding the input signal in accordance with the non-binary LDPC code is configured so as to make the group of outputs of multi-value symbols expressed by symbol likelihood from the demodulating unit 32 and the group of inputs of the decoding unit 35 comprised of the GF(q) non-binary LDPC code match one-to-one to enable the demodulating unit and decoding unit to be directly connected.

As explained above, in the receiver 3 in the wireless communication system 1 according to the present invention, the point is to make the output of the demodulator 34 and the input of the decoding unit 35 completely match one-to-one. To realize such a one-to-one complete match, a predetermined condition must be satisfied.

For this predetermined condition, the number of transmitting antennas, order of modulation, and dimensions q of GF(q) (number of elements) are important parameters.

More specifically, the number (Nt) of the plurality of transmitting antennas 26-0 to 26-(Nt−1) and the order of modulation (m) of the number of bits per modulated symbol forming the signal modulated by a predetermined modulation scheme and transmitted from the transmitter 2 are set linked with the dimension q of GF(q).

More specifically, the above-mentioned number (Nt) of the plurality of transmitting antennas and the order of modulation (m) may be set by linking them with the dimension q of GF(q) based on the following condition equation (1):

$$q = 2^{Nt \cdot m} \quad (1)$$

As a general example, assume that (i) the transmitting multi-antenna part 26 is comprised of two individual transmitting antennas 26-0 and 26-1 and (ii) the transmission signal modulated by 16 QAM from the transmitter 2 is transmitted from that antenna part 26 toward the receiver 3. That is, for the (i), the number Nt of antennas becomes 2, while for the (ii), the order of modulation m becomes 4.

This being so, the dimension q of a GF(q) is $q = 2^{2 \cdot 4} (= 2^8)$, that is, 256. That is, in a wireless communication system 1 where the values Nt=2 and m=4, by making the dimension of the non-binary LDPC decoding unit 35 "256", as already explained, the decoding unit 35 performs decoding without loss of (i) the information regarding the bit correlation among the plurality of transmitting antennas and (ii) the information regarding the bit correlation in the modulated symbols before the decoding. Therefore, compared with a conventional receiver 4 accompanied with loss of these information, the deterioration of the decoding characteristic is greatly reduced.

As explained above, under the condition of $q=2^{Nt \cdot m}$, when the output of the demodulating unit 32 and the input of the decoding unit 35 are made to completely match one-to-one, the following condition equation (2) of $F_k^j$ stands. Conversely speaking, if designing the demodulator 34 of the demodulating unit 32 so as to determine the symbol likelihood (F) satisfying the condition equation (2) of $F_k^j$, one-to-one linkage with the decoding unit 35 becomes possible. That condition equation (2) is the following $$F_k^j = \alpha \exp\left[-\frac{\|y_k - \Omega x_j\|^2}{\sigma^2}\right] \quad (2)$$

Here, the index (see "j" between the demodulator 34 and decoding unit 35 of FIG. 2) expresses the order (0, 1 ..., q−1) assigned to the group of q number of inputs (symbol likelihoods), while index "k" expresses the time index of the input of the symbol likelihood. Further, "$y_k$" expresses a k-th received signal vector, "$x_j$" expresses a replica for the j-th transmission signal vector (explained later), and "$\Omega$" multiplied with that $x_j$ expresses a channel coefficient matrix estimated by the channel coefficient estimating unit 33. On the other hand, the denominator side "$\sigma^2$" expresses an average power of noise, further the exp coefficient "$\alpha$" expresses a normalization constant for normalization so that a sum of $F_k^j$ relating to all j becomes 1. Further, "$\| \|^2$" (norm) at the numerator expresses a sum of the square of the absolute value of each element in the vector.

Here it should be noted that the equation of the $F_k^j$ does not include the symbol Σ (symbol of addition). This addition operation is essential in the above-mentioned "marginalization" of the prior art, but according to the present invention, this "marginalization" is eliminated. Therefore, the problem of the above-mentioned "loss of correlation information" due to this marginalization disappears. That is, the deterioration of the decoding characteristic at the receiver side is greatly reduced. That effect is shown by a graph.

Figure 6:
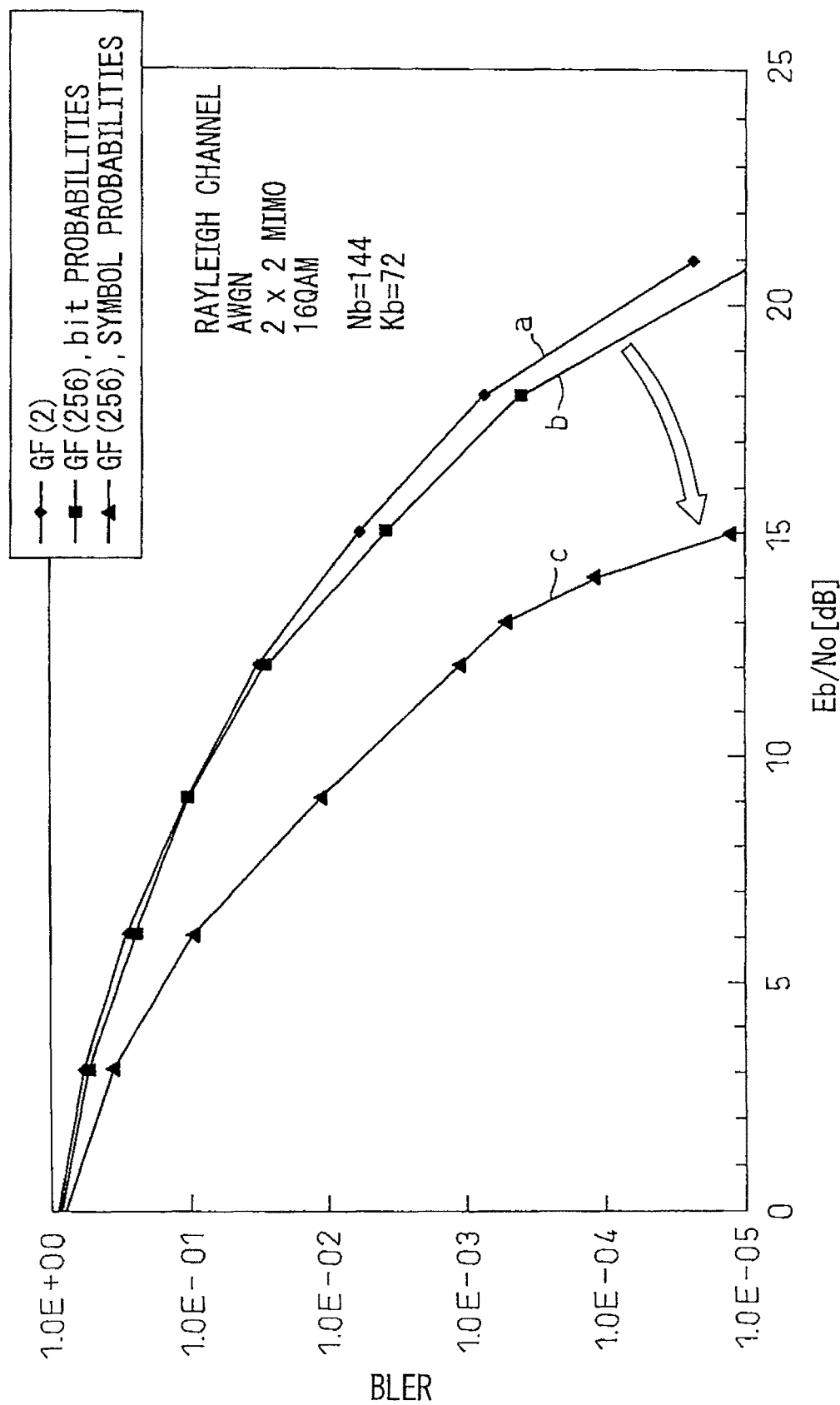
FIG. 6 is a graph of the results of comparison of decoding characteristics between the present invention and the prior art.

FIG. 6 is a graph showing the results of comparison of the decoding characteristics between the present invention and the prior art. That is, it is a graph showing an example of the results of simulation for clarifying the excellent effects according to the present invention.

In the graph of FIG. 6, the ordinate shows the "block error rate" (BLER), while the abscissa shows the "ratio of the signal power per bit to the density of the noise power (Eb/No) [dB]". Further, as shown at the top right of the graph, it is an example of the case of using noise comprised of Additive White Gaussian Noise (AWGN), employing a two transmitting antenna/two receiving antenna MIMO antenna system, and using a 16 QAM modulation scheme.

In the graph, the curve "a" shows the characteristic of the case of the conventional general binary LDPC coding scheme, while the curve "b" shows the characteristic of the case of the normal non-binary LDPC coding scheme accompanied with the above-mentioned "marginalization"—both conventional types.

As opposed to this, the curve "c" shows the characteristic in the case of demodulation based on the non-binary LDPC coding/decoding scheme according to the present invention, that is, the equation (2).

Comparing these curves "a", "b", and "c", it is learned that the present invention ("c") greatly improves the BLER compared with the conventional types ("a", "b") and has almost none of the already explained "deterioration of the decoding characteristic".

Here, the "marginalization" causing the already explained "deterioration of the decoding characteristic" will be explained. In general, as the signal processing at the receiving side of a wireless communication system, MMSE (Minimum Mean Square Error) demodulation (equalization) or MLD (Maximum Probability Detection) demodulation (equalization) is used.

This MLD demodulation is a scheme using "replicas" of all possible transmitted bit patterns to find the post-establishment of the bits. "Replica" means the data D' which should be received at the receiving side when the transmitting side transmits the data D. For example, in the case of the 4-bit data D, 16 replicas (D') are formed.

The MLD demodulation naturally involves a larger amount of processing compared with the MMSE demodulation of just linear processing, but conversely use of this greatly improves the decoding characteristic.

Here, if the channel coefficient matrix, as explained regarding the channel coefficient estimating unit 33 of FIG. 2, is $\Omega$, the received signal vector from the receiving antenna 31 is y, and the noise vector is n, the function among these is expressed by the following equation:

$$y = \Omega x + n \quad (4)$$

At this time, the MMSE weight is given by $$W = \Omega^H (\Omega \Omega^H + \sigma^2 I)^{-1} \quad (5)$$

Here, $\sigma^2$ is the average noise power shown by the above equation (2), while I is the unit matrix. This MMSE demodulation (equalization) is obtained by multiplying the received signal vector y with the MMSE weight W.

The MLD demodulation giving a better decoding characteristic than this MMSE demodulation finds the already explained bit likelihood (F) in accordance with the following equation (6).

$$F_j = \frac{\sum_{x:bj=0} \exp\left[-\frac{\|y - \Omega x\|^2}{\sigma^2}\right]}{\sum_{x:bj=1} \exp\left[-\frac{\|y - \Omega x\|^2}{\sigma^2}\right]} \quad (6)$$

At the numerator of the equation (6), $$\sum_{x:bj=0}$$

means to add all of the replicas where the j-th (for example, when x is 4 bits, j=1, 2, 3 ... 16) bit in the binary pattern of "1" and "0" of all of the above-mentioned transmission bits x is "0" to find the $2^{Nt \cdot m - 1}$ number of sums, while at the denominator of the equation (6), means to add all of the replicas where the j-th bit in the binary pattern of "1" and "0" of all of the above-mentioned transmission bits x is "1" to find the $2^{Nt \cdot m - 1}$ number of sums $$\sum_{x:bj=1}.$$

The bit likelihood (F) is based on the known equation $$F = Pr(b=0|r)/Pr(b=1|r)$$

whereby the equation (6) is obtained. Here, Pr(b=0|r) means the probability that a modulated and then transmitted bit b is "0" under the condition that the received signal is r, while Pr(b=1|r) means the probability that a modulated and then transmitted bit b is "1" under the condition that the received signal is r.

The MLD demodulation was explained predicated on use of a binary LDPC code. When using a non-binary code upon which the present invention is predicated, the bit probabilities are combined, the symbol likelihood is recalculated, then this is used as the input of the decoding unit 35.

In the end, if adopting the conventional method of using the MLD demodulation for calculation of the symbol likelihood, the routine starts by finding first the bit likelihood. This being so, for calculation of this bit likelihood, an operation for addition by E of the equation (6), that is, "marginalization", becomes essential and the above-mentioned "loss of correlation information" is caused. Due to this, deterioration of the already explained decoding characteristic is invited.

On the other hand, according to the equation (2) forming the basis of the routine for calculation of the symbol likelihood based on the present invention, there is no operation of addition by the above-mentioned E. The q number of symbol likelihoods obtained by this equation (2) can be directly connected as is to the q number of inputs of the decoding unit 35 of the GF(q).

Next, a second embodiment according to the present invention and a method of configuration of a wireless communication system will be explained.

Figure 7:
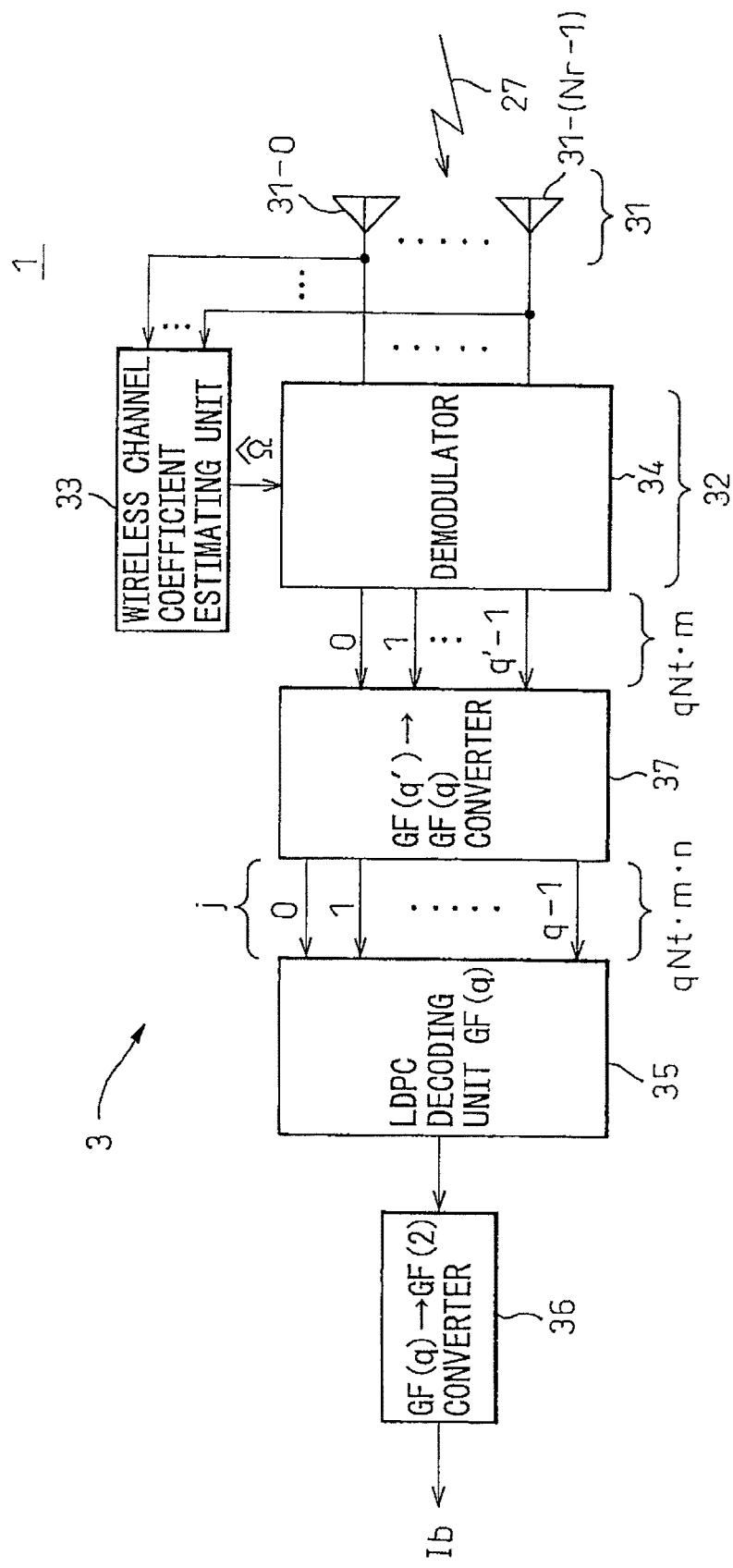
FIG. 7 is a view of a second embodiment of a receiver forming a receiving side of a wireless communication system according to the present invention.

FIG. 7 is a view showing a second embodiment of a receiver 3 forming the receiving side of the wireless communication system 1 according to the present invention. This second embodiment is characterized by linking the number (Nt) of the plurality of transmitting antennas and the order of modulation (m) with the dimension q of the GF(q) based on the following condition equation (3):

$$q = 2^{Nt \cdot m \cdot n}$$

(where, n is any natural number)

Specifically, a dimension converting unit 37 receiving the q' ($=2^{Nt \cdot m}$) number of outputs from the demodulating unit 32 as input and inputting this as q ($=2^{Nt \cdot m \cdot n}$) number of outputs to the decoding unit 35 is interposed between the demodulating unit 32 and decoding unit 35. Note that this second embodiment is exactly the same as the above-mentioned first embodiment (FIG. 2) except for the introduction of that dimension converting unit 37.

In the case of this first embodiment, the demodulating unit 32 and decoding unit 35 were directly connected completely one-to-one, but depending on the system design of the wireless system 1, sometimes the dimension q' of the output from the demodulating unit 32 does not match the dimension q of the GF(q) of the input at the decoding unit 35 and q>q'.

The second embodiment, in this case, can convert the q' to q to substantively make the demodulating unit 32 and decoding unit 35 correspond one-to-one to enable them to be directly connected. This is performed by the dimension converting unit 37. As illustrated, it converts the dimensions from GF(q') to GF(q).

In this way, according to the second embodiment, there is the advantage that the present invention can be applied even if the demodulating unit 32 and decoding unit 35 do not match in dimension by just inserting the dimension converting unit 37, but there is also another advantage.

In general, a non-binary LDPC code increases the Galois Field dimensions (q). Along with this, the amount of processing increases, but the decoding characteristic tends to become better. The second embodiment increases the dimensions of the demodulating unit 32 by $2^n$ fold, so gives rise to the advantage of a much better decoding characteristic.

Next, a method of configuration of a wireless communication system according to the present invention will be explained. This method of configuration is a method of configuration of a wireless communication system 1, as explained above, comprised of a transmitter 2 provided with a plurality of transmitting antennas 26 and a receiver 3 provided with a plurality of receiving antennas 31 transmitting and receiving information under a multi-input multi-output (MIMO) antenna system and using a non-binary LDPC code as the channel coding scheme between these transmitter 2 and receiver 3, wherein this receiver 3 includes a demodulating unit 32 for demodulating the input signal from the receiving antennas 31 and a decoding unit 35 at the output side of this demodulating unit 32 for decoding that input signal according to the non-binary LDPC code. Here, the method of configuration has at least a first step and second step.

At the first step, the dimension q of the non-binary LDPC code, linked with the number (Nt) of the plurality of transmitting antennas 26 and the number of bits per modulated symbol forming the signal of the information demodulated by a predetermined modulation scheme and transmitted from the transmitter 2, constituting the order of modulation (m), is set. Further, at the second step, the group of outputs of the multi-value symbols expressed by the symbol likelihoods from the demodulating unit 32 and the group of inputs of the decoding unit 35 comprised of the non-binary LDPC code of dimensions (q) are made to match one-to-one and these demodulating unit 32 and decoding unit 35 are directly connected.

When the wireless communication system 1 is a wireless communication system provided with an adaptive modulation function, the number of transmitting antennas and modulation scheme frequently change according to the state of the channel coefficient (wireless channel 27). In the case of this wireless communication system, the dimension (q) set at the first step can be suitably determined in accordance with the values of the number (Nt) of transmitting antennas and order of modulation (m) determined in accordance with the configuration of that wireless system.

Figure 8:
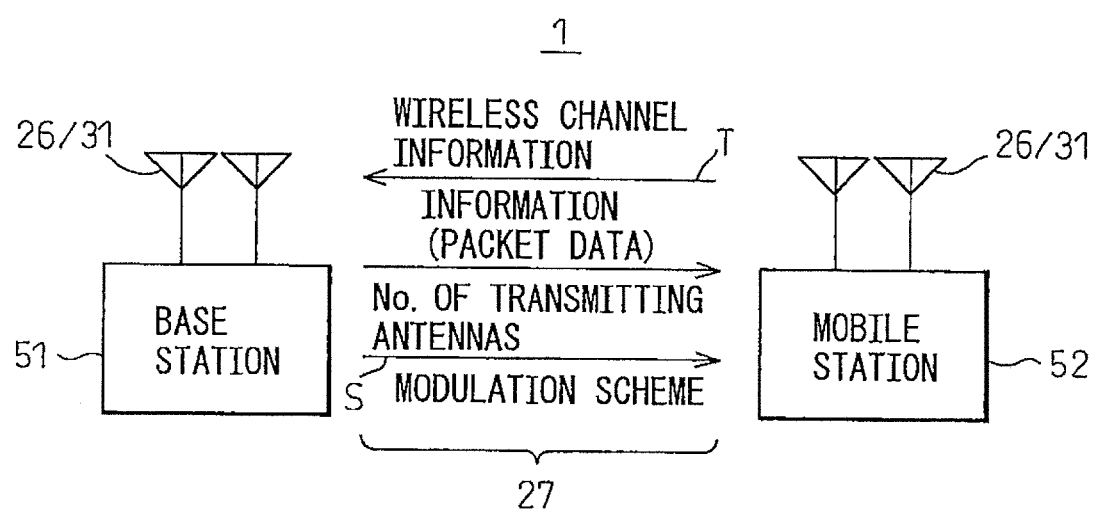
FIG. 8 is a view of an example of a wireless communication system provided with an adaptive modulation function.

FIG. 8 is a view of an example of a wireless communication system provided with an adaptive modulation function. This wireless communication system 1 is comprised of for example a base station 51 and a mobile station 52 facing each other across a wireless channel 27. These stations 51 and 52 are provided with pluralities of transmitting/receiving antennas 26/31.

In this wireless communication system of FIG. 8, before the first step, a notification step is provided. This notification step notifies the receiver (mobile station 52) of transmission specification information (see FIG. 7) including at least the number (Nt) of transmitting antennas and order of modulation (m) determined in accordance with the configuration of the wireless system 1.

Note that the second step may include a step of reconstructing the demodulating unit 32 so as to make the above-mentioned group of outputs and group of inputs match one-to-one or this second step may include a step converting the dimensions between the demodulating unit 32 and decoding unit 35 so as to make the above-mentioned group of outputs and group of inputs match one-to-one (see dimension converter 37 of FIG. 7).

Referring to FIG. 8 again, when considering downlink adaptive modulation, the mobile station 52 measures the state of the downlink wireless channel and notifies it to the base station 51 through an uplink. The base station 51 determines the number (Nt) of transmitting antennas, the modulation scheme (m), the coding rate (R), etc. based on the received downlink channel coefficient information T. Simultaneously, it determines the dimension (q) of the non-binary LDPC code used. In the above preferred example, $q=2^{Nt \cdot m}$.

The base station 51 performs coding and modulation in accordance with the determined parameters and transmits the transmission signal. Simultaneously, it notifies the mobile station 52 of these parameters (the transmission specification information S). The mobile station 52 receiving the parameters (S) performs demodulation (32) and decoding (35) based on the parameters. In this case, as already explained, the dimension (q) of the non-binary LDPC code is uniquely determined from the information of the parameters (S) received.

Figure 9:
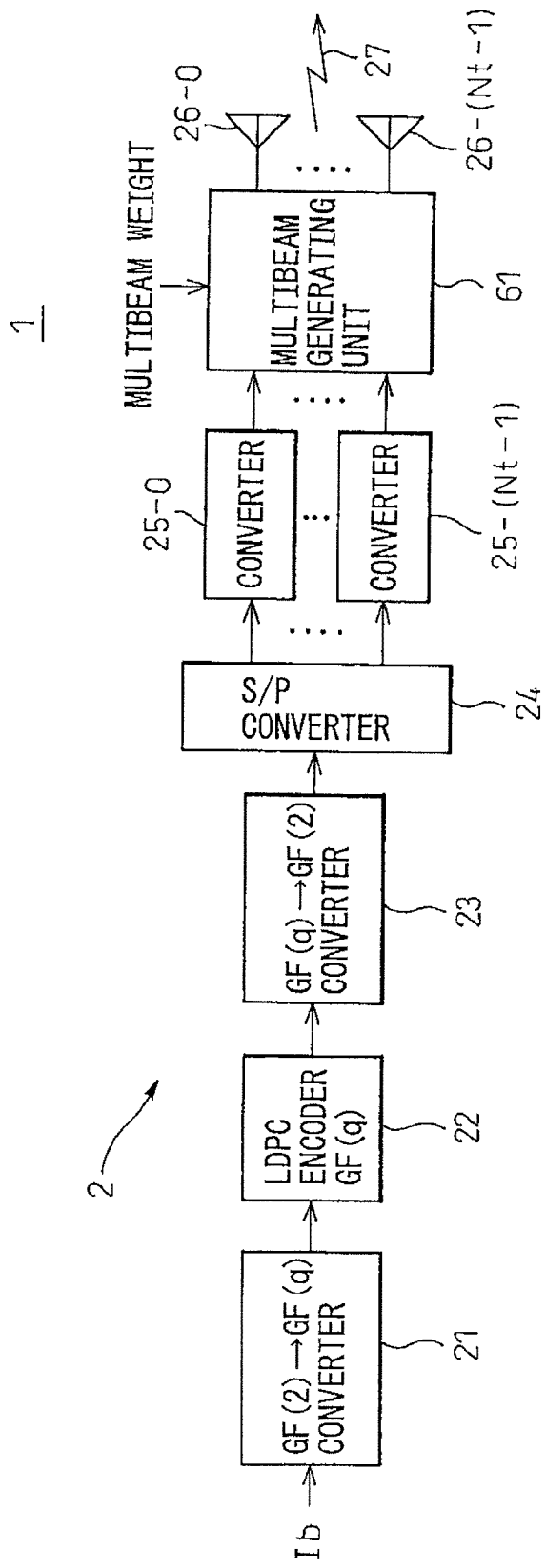
FIG. 9 is a view of an example of a transmitter of a multi-beam MIMO antenna system.

The wireless communication system 1 of the present invention explained above may not only be configured by a conventional MIMO antenna system, but may also be configured by a "multi-beam MIMO" antenna system proposed in 3GPP in recent years. FIG. 9 is a view of an example of a transmitter according to a multi-beam MIMO antenna system.

The component to note in FIG. 9 is a multi-beam generating unit 61. This forms a multi-beam MIMO. Therefore, the MIMO antenna system explained with reference to FIG. 1, FIG. 2, etc. may be made a multi-beam MIMO antenna system where the transmitter 2 as shown in FIG. 9 transmits the transmission signals from the transmitting antennas multiplied with a fixed weight.

As explained above, according to the present invention, as shown in FIG. 6, a wireless communication system is realized which can greatly suppress the "deterioration of the decoding characteristic" at the receiver side.

The invention claimed is:

1. A wireless communication system comprising a transmitter provided with a plurality of transmitting antennas and a receiver provided with a plurality of receiving antennas transmitting and receiving information under a multi-input multi-output (MIMO) antenna system and using a non-binary LDPC code as a channel coding scheme between said transmitter and receiver, said receiver comprising:
a demodulating unit for demodulating an input signal from said receiving antennas and a decoding unit at the output side of said demodulating unit for decoding said input signal according with said non-binary LDPC code, wherein the receiver makes a group of outputs of multi-value symbols expressed by symbol likelihood, output from said demodulating unit and the group of inputs of said decoding unit comprised of a non-binary LDPC code of predetermined dimension (q) match one-to-one to enable said demodulating unit and said decoding unit to be directly connected, wherein a number (Nt) of said plurality of transmitting antennas and a number of bits per modulation signal forming a signal of said information modulated by a predetermined modulation scheme and transmitted from said transmitter, constituting an order of modulation (m), are set with said dimension (q) and said demodulating unit determining said symbol likelihood (F) in accordance with the following condition equation:

$$F_k^j = \alpha \exp\left[-\frac{\|y_k - \Omega x_j\|^2}{\sigma^2}\right]$$

(where, an index "j" expresses an order (0, 1 . . . q−1) assigned to a group of q number of inputs, an index "k" expresses the order of input of symbol likelihood in a time direction, "$y_k$" expresses a k-th received signal vector, "$x_j$" expresses a replica for a j-th transmission signal vector, "$\Omega$" expresses a channel coefficient matrix estimated by channel coefficient estimation, "$\sigma^2$" expresses an average power of noise, "$\alpha$" expresses a normalization constant for normalization so that a sum of $F_k^j$ relating to all j becomes 1, "$\|\ \|^2$" (norm) expresses a sum of the square of the absolute value of each element in the vector), and said number (Nt) of the plurality of transmitting antennas and said order of modulation (m) are linked with the dimension (q) based on the following condition equation:

$$q = 2^{Nt \cdot m \cdot n} \text{(where, } n \text{ is any positive integer).}$$

2. A wireless communication system as set forth in claim 1, characterized in that a dimension converting unit receiving as input q' ($=2^{Nt \cdot m}$) number of outputs from said demodulating unit and inputting q ($=2^{Nt \cdot m \cdot n}$) number of outputs to said decoding unit is interposed between said demodulating unit and decoding unit.

3. A receiver provided with a plurality of receiving antennas for transmitting and receiving information with a transmitter provided with a plurality of transmitting antennas under a multi-input multi-output (MIMO) antenna system and using a non-binary LDPC code as a channel coding scheme for transmission and reception with said transmitter, said receiver making a group of outputs of multi-value symbols expressed by symbol likelihood from a demodulating unit and a group of inputs of a decoding unit comprised of a non-binary LDPC code of a predetermined dimension (q) match one-to-one to enable said demodulating unit and said decoding unit to be directly connected in a receiving part including a demodulating unit demodulating information input from said receiving antennas and a decoding unit at an output side of said demodulating unit and decoding said input signal in accordance with said non-binary LDPC code, wherein a number (Nt) of said plurality of transmitting antennas and a number of bits per modulation signal forming a signal of said information modulated by a predetermined modulation scheme and transmitted from said transmitter, constituting an order of modulation (m), are set with said dimension (q) and said demodulating unit determining said symbol likelihood (F) in accordance with the following condition equation:

$$F_k^j = \alpha \exp\left[\frac{\|y_k - \Omega x_j\|^2}{\sigma^2}\right]$$

(where, an index "j" expresses an order (0, 1 ... q-1) assigned to a group of q number of inputs, an index "k" expresses an order of input of symbol likelihood in a time direction, "$y_k$" expresses a k-th received signal vector, "$x_j$" expresses a replica for a j-th transmission signal vector, "$\Omega$" expresses a channel coefficient matrix estimated by channel coefficient estimation, "$\sigma^{-2}$" expresses an average power of noise, "$\alpha$" expresses a normalization constant for normalization so that a sum of $F_k^j$ relating to all j becomes 1, "$\|\ \|^2$" (norm) expresses a sum of the square of the absolute value of each element in the vector), and said number (Nt) of the plurality of receiving antennas and said order of modulation (m) are linked with said (q) based on the following condition equation:

$$q = 2^{Nt \cdot m \cdot n} \text{(where, } n \text{ is any natural number).}$$

4. A receiver as set forth in claim 3, characterized in that a dimension converting unit receiving as input q' ($=2^{Nt \cdot m}$) number of outputs from said demodulating unit and inputting q ($=2^{Nt \cdot m \cdot n}$) number of outputs to said decoding unit is interposed between said demodulating unit and decoding unit.

5. A method of configuration of a wireless communication system comprised of a transmitter provided with a plurality of transmitting antennas and a receiver provided with a plurality of receiving antennas transmitting and receiving information under a multi-input multi-output (MIMO) antenna system and using a non-binary LDPC code as a channel coding scheme between said transmitter and receiver, said receiver, comprising a demodulating unit demodulating information input from said receiving antennas and a decoding unit at an output side of said demodulating unit and decoding said input information by using said non-binary LDPC code, performs a first step, at the demodulating unit, of setting the dimension q of said non-binary LDPC code, linked with the number (Nt) of said plurality of transmitting antennas and the number of bits per modulated symbol forming the signal of said information demodulated by a predetermined modulation scheme and transmitted from said transmitter, constituting the order of modulation (m), where the dimension q is adaptively determined in accordance with values of the number (Nt) of said transmitting antennas and said order of modulation (m) determined in accordance with the configuration of said wireless s stem and said number Nt of the plurality of receiving antennas and said order of modulation (m) are linked with said (q) based on the following condition equation:

$$q = 2^{Nt \cdot m \cdot n} \text{(where, } n \text{ is any natural number),}$$

and a second step of making a group of outputs of multi-value symbols expressed by the symbol likelihoods from said demodulating unit and a group of inputs of the decoding unit comprised of the non-binary LDPC code of dimension q match one-to-one to directly connect these demodulating unit and decoding unit, wherein said demodulating unit determines said symbol likelihood (F) in accordance with the following condition equation:

$$F_k^j = \alpha \exp\left[-\frac{\|y_k - \Omega x_j\|^2}{\sigma^2}\right]$$

(where, an index "j" expresses an order (0,1 ... q-1) assigned to a group of q number of inputs, an index "k" expresses an order of input of symbol likelihood in a time direction, "$y_k$" expresses a k-th received signal vector, "$x_j$" expresses a replica for a j-th transmission signal vector, "$\Omega$" expresses a channel coefficient matrix estimated by channel coefficient estimation, "$\delta^2$" expresses an average power of noise, "$\alpha$" expresses a normalization constant for normalization so that a sum of $F_k^j$ relating to all j becomes 1, "$\|\ \|^2$" (norm) expresses a sum of the square of the absolute value of each element in the vector).

6. A method of configuration of wireless communication system as set forth in claim 5, characterized by providing, before said first step, a notification step of notifying said receiver of transmission specification information including at least the values of the number (Nt) of said transmitting antennas and said order of modulation (m) determined in accordance with the configuration of said wireless system.

7. A method of configuration of wireless communication system as set forth in claim 5, characterized in that said second step includes a step of reconstructing said demodulating unit to make said group of outputs and said group of inputs match one-to-one.

8. A method of configuration of a wireless communication system as set forth in claim 5, characterized in that said second step includes a step of converting dimensions between said demodulating unit and said decoding unit to make said group of outputs and said group of inputs match one-to-one.

* * * * *